United States Patent
Chen et al.

(10) Patent No.: US 9,013,215 B2
(45) Date of Patent: Apr. 21, 2015

(54) SIGNAL PROCESSING APPARATUS AND ASSOCIATED METHOD

(71) Applicant: MStar Semiconductor, Inc., Hsinchu Hsien (TW)

(72) Inventors: Chien-Sheng Chen, Hsinchu Hsien (TW); Shih-Chieh Yen, Hsinchu Hsien (TW); Chien-Shan Chiang, Hsinchu Hsien (TW); Ying-Chieh Chiang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/967,495

(22) Filed: Aug. 15, 2013

(65) Prior Publication Data

US 2014/0159788 A1    Jun. 12, 2014

(30) Foreign Application Priority Data

Dec. 12, 2012    (TW) .............................. 101146991 A

(51) Int. Cl.
*H03L 7/06*    (2006.01)
*H03L 7/085*    (2006.01)
*H03L 7/08*    (2006.01)

(52) U.S. Cl.
CPC .............. *H03L 7/085* (2013.01); *H03L 7/0807* (2013.01)

(58) Field of Classification Search
CPC ................................ H03L 7/085; H03L 27/34
USPC ........... 327/147, 156, 158; 375/371, 373, 375
See application file for complete search history.

(56) References Cited

U.S. PATENT DOCUMENTS

2003/0056157 A1*    3/2003    Fala et al. ..................... 714/700

* cited by examiner

*Primary Examiner* — John Poos
(74) *Attorney, Agent, or Firm* — WPAT, PC; Justin King

(57) ABSTRACT

A signal processing apparatus includes: a signal conversion circuit, for performing a signal conversion operation on a reception signal to generate a first output signal according to a first clock signal, and performing the signal conversion operation on the reception signal according to a second clock signal to generate a second output signal; an amplitude adjustment circuit, coupled to the signal conversion circuit, for calculating an amplitude value of the reception signal according to the first output signal, and accordingly adjusting an amplitude of the reception signal; and a phase adjustment circuit, for adjusting a phase of the second clock signal according to the second output signal.

14 Claims, 4 Drawing Sheets

SIGNAL PROCESSING APPARATUS AND ASSOCIATED METHOD

This application claims the benefit of Taiwan application Serial No. 101146991, filed Dec. 12, 2012, the subject matter of which is incorporated herein by reference.

BACKGROUND OF THE INVENTION

1. Field of the Invention

The invention relates in general to a signal processing apparatus and associated method, and more particularly to a signal processing apparatus capable of directly performing a signal conversion operation on a reception signal and associated method.

2. Description of the Related Art

Radio frequency identification (RFID) is a wireless communication technique, which, without establishing mechanical or optical contact between an identification system and a predetermined target, identifies the predetermined target and reads/writes associated data through radio signals. An RFID signal is an amplitude shift keying (ASK) modulation signal. In general, an envelope detector may be utilized for demodulating an RFID signal to remove carrier waves on the RFID signal while leaving envelopes containing data. Further, in order to reinforce demodulation sensitivity, the envelope detector includes an amplifier and an analog-to-digital converter (ADC) for converting data of the RFID signal to digital data and to feed the digital data to a digital signal processor (DSP). In another conventional approach, the RFID signal is down-converted by use of a mixer to generate a baseband signal, which is then converted to digital data further fed to a DSP. However, the above architecture suffers from the setback of complicated circuitry. Moreover, since the RFID signal can only be demodulated into effective data with significance after undergoing processes of several circuits, issues including distortion, a lowered signal-to-noise ratio (SNR) and an increased bit error rate are incurred as the RFID signal is affected by circuit linearity and bandwidth. Further, when a multi-stage amplifier is employed for amplifying the RFID signal, in order to prevent non-signal DC components from being excessively amplified, an AC coupling circuit is usually added in between for removing the DC components. However, if a high-pass corner of the multi-stage amplifier gets too high, low-frequency components in the RFID signal may also be filtered out to similarly lead to signal distortion. Conversely, to render a low high-pass corner, the size of a corresponding resistor or capacitor needs to be enlarged such that manufacturing costs of a chip are increased. Therefore, there is a need for a solution in the art for high-accuracy and low-cost RFID signal processing circuitry.

SUMMARY OF THE INVENTION

The invention is directed to a signal processing apparatus capable of directly performing a signal conversion operation on a reception signal and associated method.

According to a first embodiment of the present invention, a signal processing apparatus is provided. The signal processing apparatus comprises: a signal conversion circuit, for performing a signal conversion operation on a reception signal according to a first clock signal to generate a first output signal, and performing the signal conversion operation on the reception signal according to a second clock signal to generate a second output signal; an amplitude adjustment circuit, coupled to the signal conversion circuit, for calculating an amplitude value of the reception signal according to the first output signal and accordingly adjusting an amplitude of the reception signal; and a phase adjustment circuit, for adjusting a phase of the second clock signal according to the second output signal.

According to a second embodiment of the present invention, a signal processing method is provided. The method comprises: providing a signal conversion circuit for performing a signal conversion operation on a reception signal according to a first clock signal to generate a first output signal; calculating an amplitude value of the reception signal according to the first output signal and accordingly adjusting an amplitude of the reception signal; performing the signal conversion operation on the reception signal by the signal conversion circuit according to a second clock signal to generate a second output signal; and adjusting a phase of the second clock signal according to the second output signal.

With the above embodiments, a signal conversion operation can be directly performed on a reception signal to generate an output signal, and so an envelope of the reception signal can be accurately retrieved while providing an optimal SNR. Further, since a control clock in embodiments of the present invention can be synthesized from an external reception signal, the embodiments of the present invention also feature low costs.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
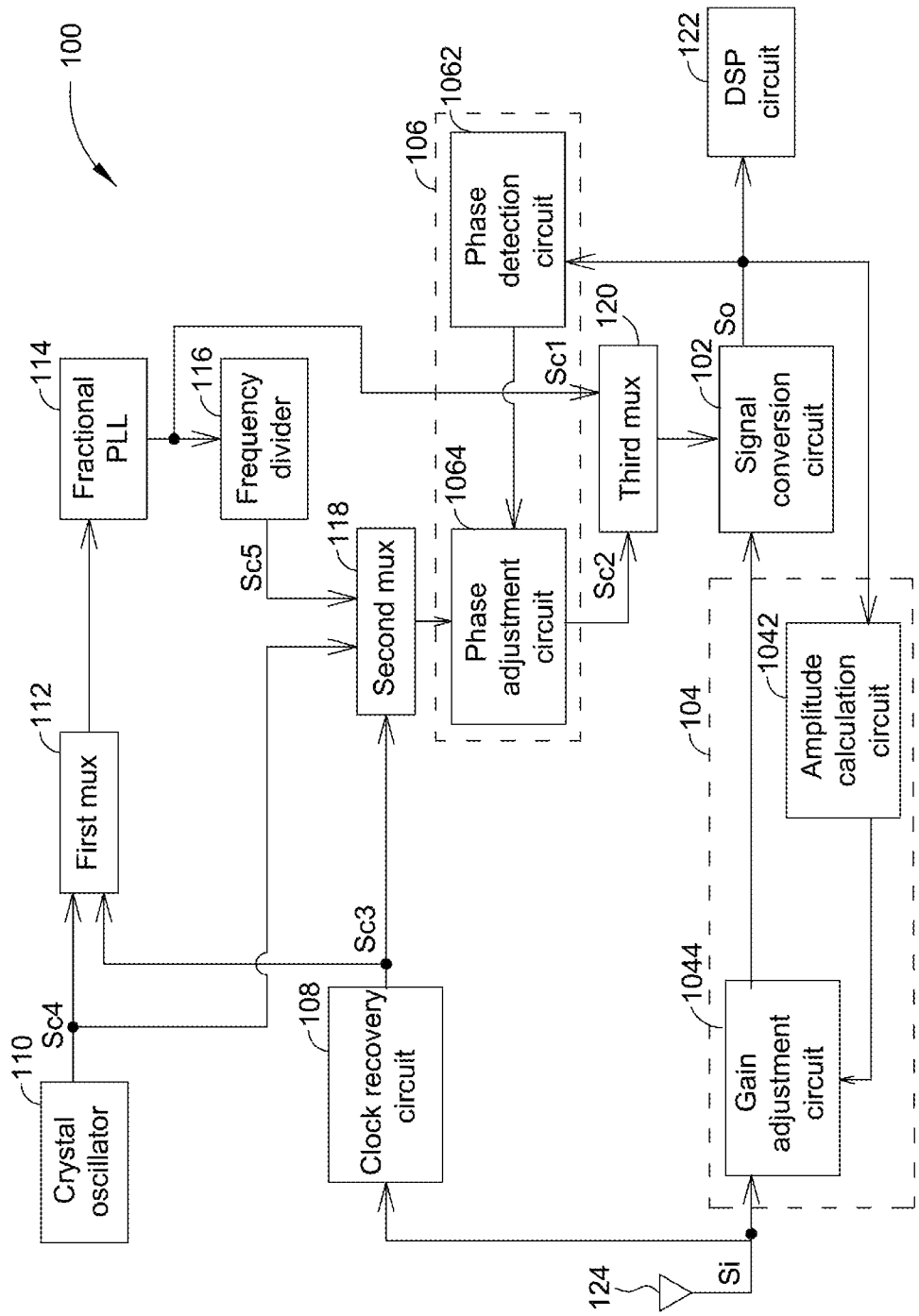
FIG. 1 is a schematic diagram of a signal processing apparatus according to a first embodiment of the present invention.

FIG. 1 shows a schematic diagram of a signal processing apparatus 100 according to an embodiment of the present invention. Referring to FIG. 1, for example, the signal processing apparatus 100 may be a radio frequency identification (RFID) signal processing circuit. The signal processing apparatus 100 comprises a signal conversion circuit 102, an amplitude adjustment circuit 104, a phase adjustment circuit 106, a clock recovery circuit 108, a crystal oscillator 110, a first multiplexer (mux) 112, a fractional phase-locked loop (PLL) 114, a frequency divider 116, a second multiplexer 118, a third multiplexer 120, a digital signal processing (DSP) circuit 122, and an antenna 124. The signal conversion circuit 102 selectively performs a signal conversion operation on a reception signal Si according to a first clock signal Sc1 or a second clock signal Sc2 to generate an output signal So. When the signal conversion circuit 102 selects the first clock signal Sc1 to perform the signal conversion operation on the reception signal Si to generate the output signal So, the amplitude adjustment circuit 104 calculates a first amplitude A1 of the reception signal Si according to the output signal So, and adjusts the reception signal Si according to the first amplitude A1 to generate the reception signal Si having a second amplitude A2 to the signal conversion circuit 102. When the signal conversion circuit 102 selects the second clock signal Sc2 to perform the signal conversion operation on the reception signal Si having the second amplitude A2 to generate the output signal So, the phase adjustment circuit 106 adjusts a first phase P1 of the second clock signal Sc2 according to the reception signal Si having the second amplitude A2, and generates the second clock signal Sc2 having a second phase P2 to the signal conversion circuit 102. The signal conversion circuit 102 further performs the signal conversion operation on the reception signal Si having the second amplitude A2 according to the second clock signal Sc2 having the second phase P2 to generate the output signal So.

The clock recovery circuit 108 receives the reception signal Si, and generates a third clock signal Sc3 corresponding to a carrier signal in the reception signal Si. The crystal oscillator 110 generates a fourth clock signal Sc4. The first multiplexer 112, coupled to the clock recovery circuit 108 and the crystal oscillator 110, selectively outputs either the third clock signal Sc3 or the fourth clock signal Sc4. The fractional PLL 114, coupled to the first multiplexer 112, generates the first clock signal Sc1 according to either the third clock signal Sc3 or the fourth clock signal Sc4. The frequency divider 116, coupled to the fractional PLL 114, frequency-divides the first clock signal Sc1 to generate a fifth clock signal Sc5. The second multiplexer 118, coupled to the clock recovery circuit 108, the crystal oscillator 110 and the frequency divider 116, selectively outputs one of the third clock signal Sc3, the fourth clock signal Sc4, or the fifth clock signal Sc5 as the second clock signal Sc2. The third multiplexer 120, coupled to the phase adjustment circuit 106 and the fractional PLL 114, selectively outputs either the second clock signal Sc2 having the second phase P2 or the first clock signal Sc1 to the signal conversion circuit 102. Further, the antenna 124, coupled to the amplitude adjustment circuit 104 and the clock recovery circuit 108, receives the reception signal Si and transmits the reception signal Si to the amplitude adjustment circuit 104 and the clock recovery circuit 108.

Since the signal processing apparatus 100 may be an RFID signal processing circuit, the reception signal Si is correspondingly an amplitude shift keying (ASK) modulation signal, for example. However, it should be noted that, any modulation signal having characteristics including constant amplitude is encompassed within the scope of the present invention. In the embodiment, the first clock signal Sc1 has a first oscillation frequency F1, the second clock signal Sc2 has a second oscillation frequency F2, and the reception signal Si includes a carrier signal having a third oscillation frequency F3. Further, the first oscillation frequency F1 is substantially four times of the third oscillation frequency F3, and the second oscillation frequency F2 is substantially the same as the third oscillation frequency F3.

Again referring to FIG. 1, the amplitude adjustment circuit 104 comprises an amplitude calculation circuit 1042 and a gain adjustment circuit 1044. The amplitude calculation circuit 1042, coupled to the signal conversion circuit 102, calculates the first amplitude A1 of the reception signal Si according to a first sample point and a second sample point sampled from the reception signal Si by the signal conversion circuit 102 under control of the first clock signal Sc1. The gain adjustment circuit 1044, coupled to the amplitude calculation circuit 1042, amplifies the reception signal Si according to the first amplitude A1 and a signal operation range of the signal conversion circuit 102 to generate the reception signal Si having the second amplitude A2.

The phase adjustment circuit 106 comprises a phase detection circuit 1062 and a phase adjustment circuit 1064. The phase detection circuit 1062, coupled to the signal conversion circuit 102, determines a phase of the first sample point according to the first sample pointed sampled from the reception signal Si having the second amplitude by the signal conversion circuit 102 under control of the second clock signal Sc2. The phase adjustment circuit 1064, coupled to the phase detection circuit 1062, adjusts the first phase P1 of the second clock signal Sc2 according to the phase of the first sample point, and generates the second clock signal Sc2 having the second phase P2. The second clock signal Sc2 having the second phase P2 renders a second sample point sampled from the reception signal Si having the second amplitude A2 by the signal conversion circuit 102 to be a peak or a valley. As observed from FIG. 1, the second clock signal Sc2 having the second phase P2 generated by the phase adjustment circuit 1064 is selectively transmitted to the signal conversion circuit 102 via the third multiplexer 120.

Figure 2:
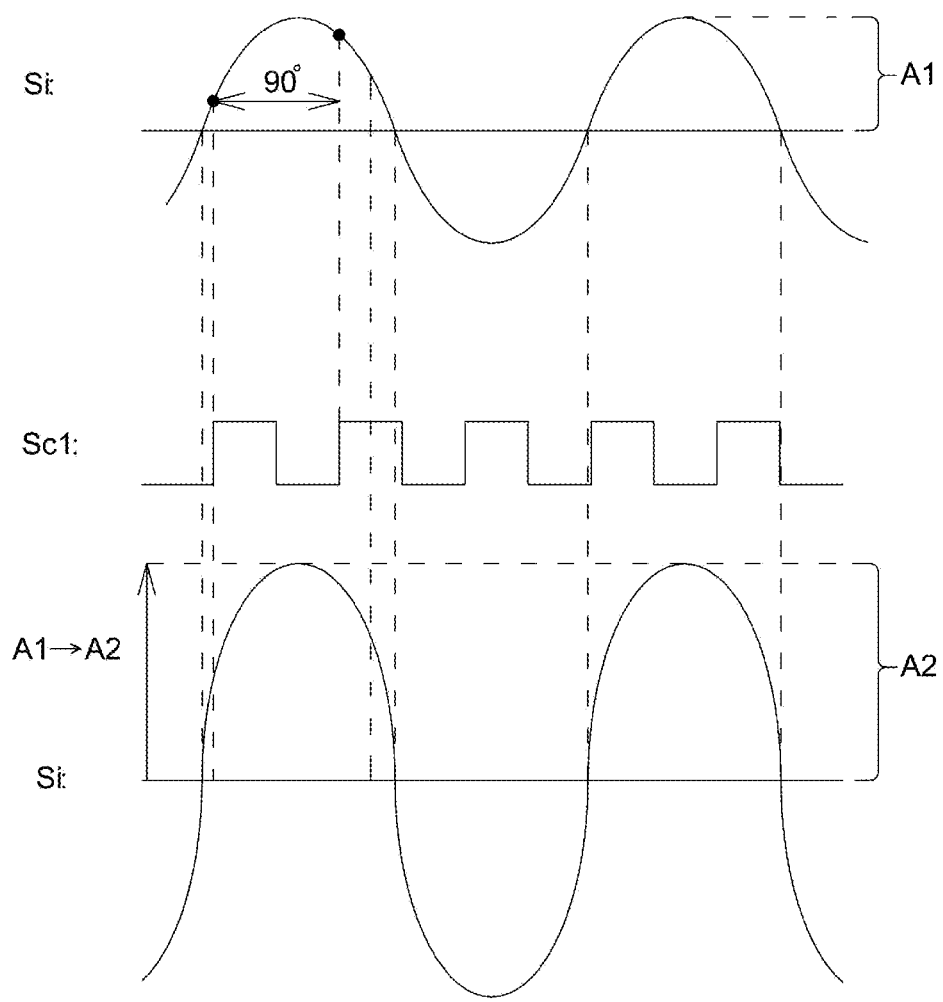
FIG. 2 is a timing diagram of a reception signal having a first amplitude, a first clock signal, and the reception signal having a second amplitude according to an embodiment of the present invention.
Figure 3:
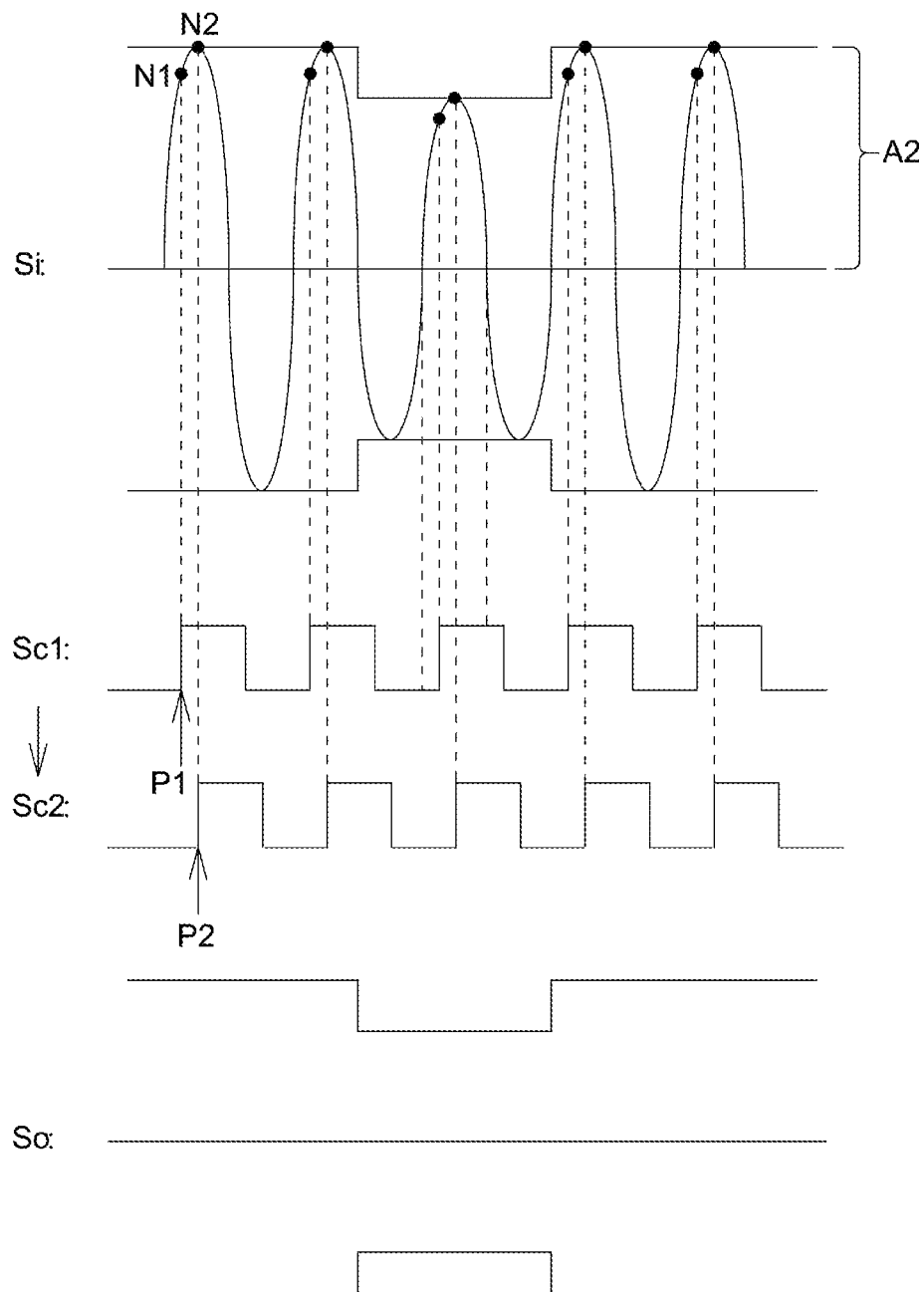
FIG. 3 is a timing diagram of a reception signal having a second amplitude, a second clock signal having a first phase, the second clock signal having a second phase, and an output signal according to an embodiment of the present invention.

FIG. 2 shows a timing diagram of a reception signal Si having a first amplitude A1, a first clock signal Sc1, and a reception signal Si having a second amplitude A2 according to an embodiment of the present invention. FIG. 3 shows a timing diagram of a reception signal Si having a second amplitude A2, a second clock signal Sc2 having a first phase P1, a second clock signal Sc2 having a second phase P2, and an output signal So according to an embodiment of the present invention. It should be noted that, the signal conversion circuit 102 of the embodiment is an analog-to-digital converter (ADC) circuit, which samples the reception signal Si to retrieve an envelope of the reception signal Si, i.e., to generate the output signal So. Therefore, when the ADC circuit samples the reception signal Si, a sample point of the ADC circuit substantially falls at the peak or the valley of the reception signal Si. Further, to provide the ADC circuit with an optimal operation range for an optimal signal-to-noise ratio (SNR), the maximum amplitude of the reception signal Si is preferably equal to a maximum acceptable signal input range of the ADC circuit. Thus, before the data carried by the reception signal Si is read by the signal processing apparatus 100 of the embodiment, the amplitude (i.e., the first amplitude A1) of the reception signal Si is adjusted by the amplitude adjustment circuit 104 to be equal to the maximum acceptable signal input range (i.e., the second amplitude A2) of the ADC circuit. The sample point of the ACD circuit is then adjusted by the phase adjustment circuit 106 to a peak or a valley of the reception signal Si.

Hence, when the signal processing apparatus 100 is activated, the antenna 124 receives the reception signal Si having the first amplitude A1. At this point, it is possible that the first amplitude A1 is smaller than or greater than the maximum acceptable signal input range of the ADC circuit. To calculate the amplitude (i.e., the amplitude A1) of the current reception signal Si, the signal conversion circuit 102 first obtains a first sample point M1 and a second sample point M2 from the reception signal Si according to the first clock signal Sc1. It should be noted that, through appropriate designs, a phase difference between the first sample point M1 and the second sample point M2 is substantially one quarter of a cycle of the reception signal Si, or 90 degrees. In other words, the signal conversion circuit 102 consecutively reads the first sample point M1 and the second sample point M2 from the reception signal Si according to a frequency four times of that of the reception signal Si, as shown in FIG. 2. Next, the amplitude calculation circuit 1042 calculates the first amplitude A1 of the reception signal Si according to an equation $(A^2 \sin^2(\omega_0 t + \phi) + A^2 \sin^2(\omega_0 t + \phi + 90°))$ where A represents the first amplitude A1, A $\sin(\omega_0 t+\phi)$ represents the voltage at the first sample point M1, A $\sin(\omega_0 t+\phi+90°)$ represents the voltage at the second sample point M2, $\omega_0$ represents an oscillation frequency of a carrier signal of the reception signal, $\phi$ represents an angle, and t represents a time. Further, the first amplitude A1 can be calculated as detailed below after obtaining the voltage A $\sin(\omega_0 t+\phi)$ at the first sample point M1 and the voltage A $\sin(\omega_0 t+\phi+90°)$ at the second sample point M2:

$$(A^2\sin^2(\omega_0 t + \phi) + A^2\sin^2(\omega_0 t + \phi + 90^0)) = (A^2[\sin^2(\omega_0 t + \phi) + \cos^2(\omega_0 t + \phi)])$$
$$= A^2$$

In other words, the first amplitude A1 can be obtained as a square root of a sum of squares of the voltage A $\sin(\omega_0 t+\phi)$ at the first sample point M1 and the voltage A $\sin(\omega_0 t+\phi+90°)$ at the second sample point M2, as below:

$$A1 = \sqrt{[A^2\sin^2(\omega_0 t + \phi) + A^2\sin^2(\omega_0 t + \phi + 90^0)]}$$
$$= A$$

In the embodiment, it is assumed that the oscillation frequency of the reception signal Si is a constant frequency (i.e., F3) during the process of calculating the first amplitude A1 of the reception signal Si. Thus, after the signal conversion circuit 102 consecutively obtains the voltage of two sample points from the reception signal Si according to a frequency four times (i.e., F1) of that of the reception signal Si, as the two sample points differ by a 90-degree phase difference, the amplitude calculation circuit 1042 is capable of calculating the first amplitude A1 of the reception signal Si using the above equations.

After the amplitude calculation circuit 1042 calculates the first amplitude A1 of the reception signal Si, the gain adjustment circuit 1044 determines a difference between the first amplitude A1 and a signal operation range of the signal conversion circuit 102 to adjust/amplify the amplitude of the reception signal Si, and generates the reception signal Si having the second amplitude A2. The second amplitude A2 is exactly equal to the signal operation range of the signal conversion circuit 102, as shown in FIG. 2. It should be noted that, the signal operation range of the signal conversion circuit 102 is also the maximum acceptable signal input range of the signal conversion circuit 102, or alternatively, a predetermined signal operation range. Thus, when the second amplitude A2 of the reception signal Si is equal to the maximum acceptable signal input range of the signal conversion circuit 102, the signal conversion circuit 102 is enabled to yield an optimal SNR when reading the reception signal Si.

When the amplitude of the reception signal Si is adjusted to the maximum acceptable signal input range of the signal conversion circuit 102, instead of the first clock signal Sc1, the second clock signal Sc2 is utilized for controlling operations of the signal conversion circuit 102. In the embodiment, the oscillation frequency (i.e., F2) of the second clock signal Sc2 is substantially equal to the oscillation frequency (i.e., F3) of the reception signal Si. To allow the signal conversion circuit 102 to correctly retrieve the envelopes of the reception signal Si, the signal conversion circuit 102 is required to sample the reception signal at a peak or a valley of each cycle of the reception signal Si.

Hence, the phase detection circuit 1062 determines a phase of a first sample point N1 according to the first sample point N1 sampled from the reception signal Si having the second amplitude A2 by the signal conversion circuit 102. Next, the phase adjustment circuit 1064 calculates a phase difference between the phase of the first sample point N1 and the phase of a peak or a valley of the reception signal Si to adjust the first phase P1 of the second clock signal Sc2, and generates the second clock signal Sc2 having the second phase P2. As such, the second clock signal Sc2 having the second phase P2 renders a second sample point N2 sampled from the reception signal Si having the second amplitude A2 by the signal conversion circuit 102 to be a peak or a valley, as shown in FIG. 3. It should be noted that, any method capable of determining the phase of a peak or a valley of the reception signal Si is encompassed within the scope of the present invention. For example, the phase detection circuit 1062 may also read the voltages at multiple sample points on the reception signal Si, and determine the phase of a peak or a valley of the reception signal Si according to the sizes of the voltages.

As observed from FIG. 3, when the signal conversion circuit 102 samples a peak of each cycle of the reception signal Si, the output signal So generated by the signal conversion circuit 102 is an envelope of the reception signal Si. Thus, the DSP circuit 122 is allowed to demodulate the data carried on the reception signal Si according to the output signal So.

Again referring to FIG. 1, the first clock signal Sc1 and the second clock signal Sc2 utilized in operations of the signal processing apparatus 100 according to an embodiment of the present invention may be retrieved from a carrier signal (i.e., an external signal) in the reception signal Si, or generated by the crystal oscillator 110 in the signal processing apparatus 100. Further, the third multiplexer 120 controls which of the first clock signal Sc1 and the second clock signal Sc2 is to be transmitted to the signal conversion circuit 102. When the first clock signal Sc1 is synthesized from a carrier signal in the reception signal Si, a generation path of the first clock signal Sc1 may be simplified into a first path. That is, the first path starts from the antenna 124, and passes through the clock recovery circuit 108, the first multiplexer 112, the fractional PLL 114, and the third multiplexer 120, to finally reach the signal conversion circuit 102. When the first clock signal Sc1 is provided by the crystal oscillator 110 in the signal processing apparatus 100, the generation path of the clock signal 51 may be simplified into a second path. That is, the second path starts from the crystal oscillator 110, and passes through the first multiplexer 112, the fractional PLL 114, and the third multiplexer 120, to finally reach the signal conversion circuit 102.

On the other hand, when the second clock signal Sc2 is synthesized from a carrier signal in the reception signal Si, a generation path of the second clock signal Sc2 may be simplified into a third path or a fourth path. The third path starts from the antenna 124, and passes through the clock recovery circuit 108, the first multiplexer 112, the fractional PLL 114, the frequency divider 116, the second multiplexer 118, the phase adjustment circuit 1064, and the third multiplexer 120, to finally reach the signal conversion circuit 102. The fourth path starts from the antenna 124, and passes through the clock recovery circuit 108, the second multiplexer 118, the phase adjustment circuit 1064, and the third multiplexer 120, to finally reach the signal conversion circuit 102.

When the second clock signal Sc2 is provided by the crystal oscillator 110 in the signal processing apparatus 100, the signal generation path of the second clock signal Sc2 may be simplified into a fifth path or a sixth path. The fifth path starts from the crystal oscillator 110, and passes through the first multiplexer 112, the fractional PLL 114, the frequency divider 116, the second multiplexer 118, the phase adjustment circuit 1064, and the third multiplexer 120, to finally reach the signal conversion circuit 102. The sixth path starts from the crystal oscillator 110, and passes through the second multiplexer 118, the phase adjustment circuit 1064, and the third multiplexer 120, to finally reach the signal conversion circuit 102.

Details of the first path, the second path, the third path, the fourth path, the fifth path, and the sixth path for generating the first clock signal Sc1 and the second clock signal Sc2 are known by a person having ordinary skill in the art, and shall be omitted herein for the sake of brevity.

As discussed in the descriptions associated with the signal processing apparatus 100, when the amplitude adjustment circuit 104 of the present invention adjusts the amplitude of the reception signal Si to be equal to the maximum acceptable signal input range of the signal conversion circuit 102, and the sample point of the signal conversion circuit 102 exactly aligns with a peak or a valley of the reception signal Si, not only the envelope of the reception signal Si can be correctly retrieved but the signal conversion circuit 102 also has an optimal SNR. Moreover, since the first clock signal Sc1 and the second clock signal Sc2 of the present invention may be synthesized from the external reception signal Si, the signal processing apparatus 100 of the present invention further features low costs.

Figure 4:
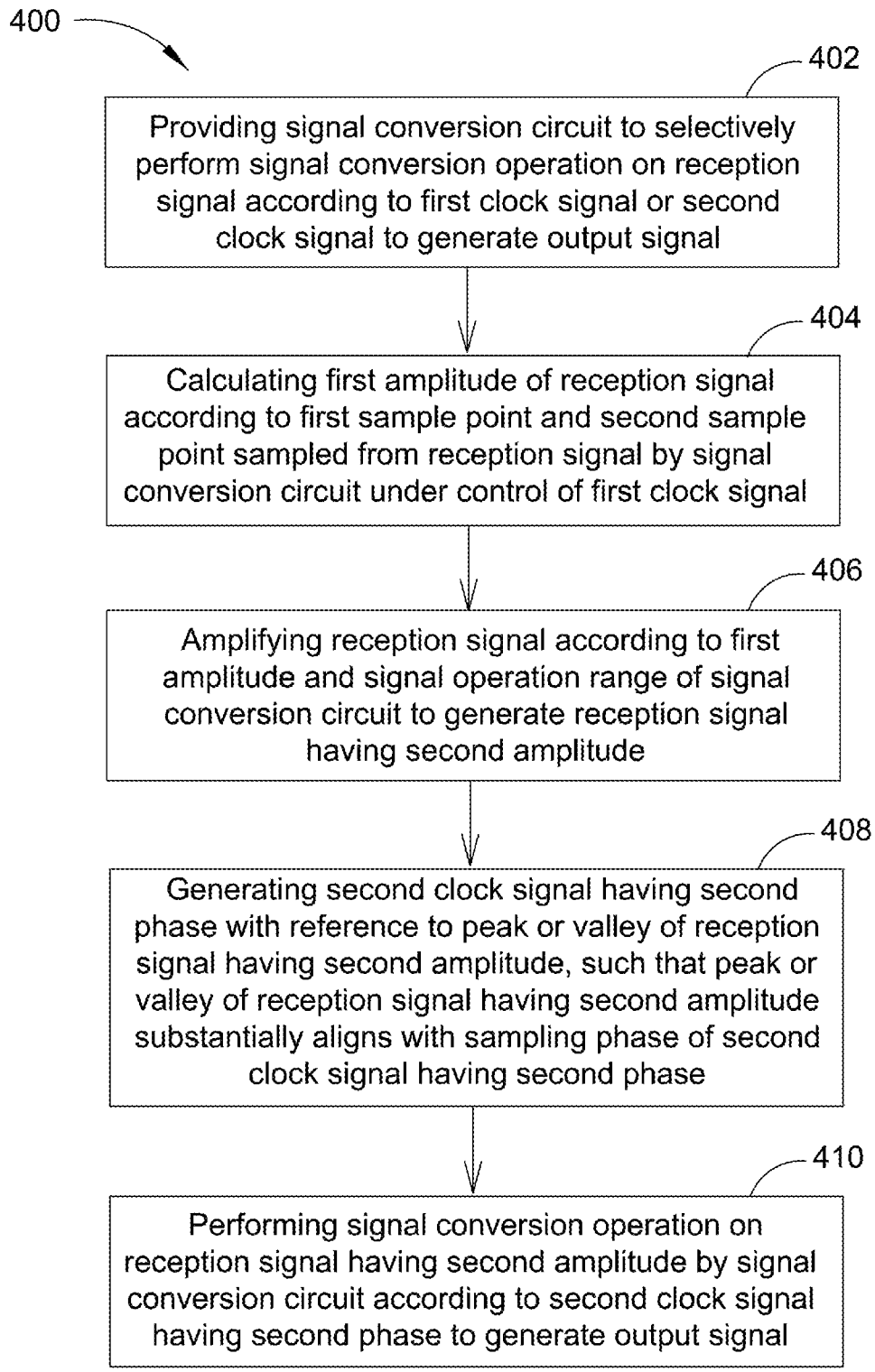
FIG. 4 is a flowchart of a signal processing method according to a second embodiment of the present invention.

The operations of the above signal processing apparatus 100 may be simplified into a process shown by a flowchart in FIG. 4. FIG. 4 shows a flowchart of a signal processing method 400 according to an embodiment of the present invention. Given that substantially same results are obtained, the steps in FIG. 4 need not be performed in the specific order shown in FIG. 4. Further, the steps in FIG. 4, rather than being performed consecutively, may be interleaved with other steps. With reference to descriptions associated with the above signal processing apparatus 100, the signal processing method 400 comprises the following steps.

In step 402, the signal conversion circuit 102 is provided to selectively perform a signal conversion operation on the reception signal Si according to the first clock signal Sc1 or the second clock signal Sc2 to generate the output signal So.

In step 404, the first amplitude A1 of the reception signal Si is calculated according to the first sample point M1 and the second sample point M2 sampled from the reception signal Si by the signal conversion circuit 102 under the control of the first clock signal Sc1.

In step 406, the reception signal Si is amplified according to the first amplitude A1 and a signal operation range of the signal conversion circuit 102 to generate the reception signal Si having the second amplitude A2.

In step 408, the second clock signal Sc2 having the second phase P2 is generated with reference to a peak or a valley of the reception signal Si having the second amplitude A2, so as to render the peak or the valley of the reception signal Si having the second amplitude A2 to align with a sample phase on the second clock signal Sc2 having the second phase P2.

In step 410, the signal conversion operation is performed on the reception signal Si having the second amplitude A2 according to the second clock signal Sc2 having the second phase P2 by the signal conversion circuit 102 to generate the output signal So.

With the above descriptions, it is demonstrated that the signal processing apparatus 100 according to an embodiment of the present invention is capable of performing a signal conversion operation on the reception signal Si to generate an output signal So, and so the signal processing apparatus 100 according to an embodiment of the present invention is capable of accurately retrieving an envelope of the reception signal Si while also providing an optimal SNR. Further, since the control clock (i.e., the first clock signal Sc1 or the second clock signal Sc2) of the signal processing apparatus 100 according to an embodiment of the present invention can be synthesized from the external reception signal Si, the signal processing apparatus 100 of the present invention also features low costs.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal processing apparatus, comprising:
   a signal conversion circuit, for performing a signal conversion operation on a reception signal according to a first clock signal to generate a first output signal;
   an amplitude adjustment circuit, coupled to the signal conversion circuit, for calculating an amplitude value of the reception signal according to the first output signal, and accordingly adjusting an amplitude of the reception signal and thereafter, the signal conversion circuit performs the signal conversion operation on the amplitude-adjusted reception signal according to a second clock signal to generate a second output signal; and
   a phase adjustment circuit, for adjusting a phase of the second clock signal according to the second output signal;
   wherein the reception signal is an amplitude shift keying (ASK) modulation final.

2. The signal processing apparatus according to claim 1, wherein the reception signal comprises a carrier signal, and a frequency of the first clock signal is substantially a frequency four times of that of the carrier signal.

3. The signal processing apparatus according to claim 1, wherein the reception signal comprises a carrier signal, and a frequency of the second clock signal is substantially equal to that of the carrier signal.

4. The signal processing apparatus according to claim 1, wherein a specific phase of the second clock signal adjusted by the phase adjustment circuit is substantially aligned with a peak or a valley of the reception signal adjusted by the amplitude adjustment circuit.

5. The signal processing apparatus according to claim 1, wherein the amplitude adjustment circuit comprises:
   an amplitude calculation circuit, for calculating the amplitude value of the reception signal according to a result of a first sample point and a result of a second sample point from the first output signal; and
   a gain adjustment circuit, for amplifying the reception signal according to the amplitude value of the reception signal and a signal operation range of the signal conversion circuit to adjust the amplitude of the reception signal.

6. The signal processing apparatus according to claim 5, wherein a phase difference between the first sample point and the second sample point is substantially one quarter of a cycle of the reception signal.

7. The signal processing apparatus according to claim 6, wherein the amplitude calculation circuit calculates the amplitude value of the reception signal by utilizing an equation: $A^2 \sin^2(\omega_0 t+\phi) + A^2 \sin^2(\omega_0 t+\phi+90°)$, where A represents the amplitude value, $A \sin(\omega_0 t+\phi+90°)$ represents a voltage of the first sample point, $A \sin(\omega_0 t+\phi+90°)$ represents a voltage of the second sample point, $\omega_0$ represents a frequency of a carrier signal of the reception signal, $\phi$ represents an angle, and t represents a time.

8. A signal processing method, comprising:
provide a signal conversion circuit, and
performing a signal conversion operation on a reception signal according to a first clock signal to generate a first output signal by the signal conversion circuit;
calculating an amplitude value of the reception signal according to the first output signal, and accordingly adjusting an amplitude of the reception signal;
performing the signal conversion operation on the amplitude-adjusted reception signal according to a second clock signal to generate a second output signal by the signal conversion circuit; and
adjusting a phase of the second clock signal according to the second output signal;
wherein the reception signal is an ASK modulation signal.

9. The signal processing method according to claim 8, wherein the reception signal comprises a carrier signal, and a frequency of the first clock signal is substantially a frequency four times of that of the carrier signal.

10. The signal processing method according to claim 8, wherein the reception signal comprises a carrier signal, and a frequency of the second clock signal is substantially equal to that of the carrier signal.

11. The signal processing method according to claim 8, wherein in the step of adjusting the phase of the second clock signal according to the second output signal, a specific phase of the phase adjusted second clock signal is substantially aligned with a peak or a valley of the amplitude-adjusted reception signal.

12. The signal processing method according to claim 8, wherein the step of calculating the amplitude value of the reception signal according to the first output signal and accordingly adjusting the amplitude of the reception signal comprises:
calculating the amplitude value of the reception signal according to a result of a first sample point and a result of a second sample point from the first output signal; and
amplifying the reception signal according to the amplitude value of the reception signal and a signal operation range of the signal conversion circuit to adjust the amplitude of the reception signal.

13. The signal processing method according to claim 12, wherein a phase difference between the first sample point and the second sample point is substantially one quarter of a cycle of the reception signal.

14. A signal processing apparatus, comprising:
a signal conversion circuit, for performing a signal conversion operation on a reception signal according to a first clock signal to generate a first output signal;
an amplitude adjustment circuit, coupled to the signal conversion circuit, for calculating an amplitude value of the reception signal according to the first output signal, and accordingly adjusting an amplitude of the reception signal and thereafter, the signal conversion circuit performs the signal conversion operation on the amplitude-adjusted reception signal according to a second clock signal to generate a second output signal; and
a phase adjustment circuit, for adjusting a phase of the second clock signal according to the second output signal;
wherein a specific phase of the second clock signal adjusted by the phase adjustment circuit is substantially aligned with a peak or a valley of the reception signal adjusted by the amplitude adjustment circuit.

\* \* \* \* \*